US012568580B2

(12) United States Patent
    Huber

(10) Patent No.: US 12,568,580 B2
(45) Date of Patent: Mar. 3, 2026

(54) SOLDERING BOARD ARRANGEMENT

(71) Applicant: PHYTEC Messtechnik GmbH, Mainz (DE)

(72) Inventor: Bodo Huber, Undenheim (DE)

(73) Assignee: PHYTEC Messtechnik GmbH, Mainz (DE)

( * ) Notice: Subject to any disclaimer, the term of this patent is extended or adjusted under 35 U.S.C. 154(b) by 171 days.

(21) Appl. No.: 18/419,721

(22) Filed: Jan. 23, 2024

(65) Prior Publication Data

US 2025/0113436 A1 Apr. 3, 2025

(30) Foreign Application Priority Data

Sep. 28, 2023 (DE) ..................... 10 2023 126 557.1

(51) Int. Cl.
    *H05K 1/14* (2006.01)
    *H01R 12/52* (2011.01)
(52) U.S. Cl.
    CPC ............. *H05K 1/141* (2013.01); *H01R 12/52* (2013.01); *H05K 2201/041* (2013.01)
(58) Field of Classification Search
    CPC ... H05K 1/141; H05K 2201/041; H01R 12/52

USPC .......................................................... 174/260
    See application file for complete search history.

(56) References Cited

U.S. PATENT DOCUMENTS

| | | | | |
|---|---|---|---|---|
| 5,743,009 | A * | 4/1998 | Matsui ............... | H01R 43/0256 |
| | | | | 29/830 |
| 11,297,715 | B2 * | 4/2022 | Huber .................... | H05K 1/111 |
| 2012/0003879 | A1 * | 1/2012 | Mason ................... | H01R 12/57 |
| | | | | 29/874 |
| 2020/0243470 | A1 * | 7/2020 | Kato ....................... | H01L 24/17 |

FOREIGN PATENT DOCUMENTS

DE 10 2020 108 239 A1 9/2021

* cited by examiner

*Primary Examiner* — Andargie M Aychillhum
(74) *Attorney, Agent, or Firm* — Collard & Roe, P.C.

(57) ABSTRACT

A soldering board arrangement has a base board, which has a holding section that has a plurality of more than 100 soldering connection points for electrical contacting for a soldering board module. The holding section has soldering connection strips that differ from the soldering connection points. The strips extend outward from the direction of a center of the holding section, and allow soldering to corners of soldering board modules of different sizes.

16 Claims, 2 Drawing Sheets

SOLDERING BOARD ARRANGEMENT

CROSS REFERENCE TO RELATED APPLICATIONS

Applicant claims priority under 35 U.S.C. § 119 of German Application No. 10 2023 126 557.1 filed Sep. 28, 2023, the disclosure of which is incorporated by reference.

BACKGROUND OF THE INVENTION

1. Field of the Invention

The invention relates to a soldering board arrangement having a base board, which comprises a holding section that has a plurality of more than 100 soldering connection points for electrical contacting for a soldering board module.

2. Description of the Related Art

On the basis of continuing development and mechanization, microcomputers are increasingly being used in industrial machines and systems, vehicles of all kinds, medical devices, household appliances and, for example, also consumer goods. The corresponding industrial developments are also summarized, colloquially, with the term Industry 4.0, wherein more and more data are recorded, processed, and linked with one another.

In the case of motor vehicles and household appliances, for example, corresponding computer systems are used, among other things, for controlling convenience and safety functions. Beyond that, linking of appliances with one another or by way of a suitable data connection is also increasingly taking place. Corresponding developments are also summarized with the term "Internet of Things."

For the applications described, computer facilities and modules having microchips, connection interfaces, sensors, as well as other active and passive components are made available, in practice, and these can be summarized with the term "embedded systems." Sub-groups of these are, for example, single-board computers, which form a complete computer unit or a system on module, which can be combined with further modules or a motherboard, which is also referred to as a base board within the scope of the invention.

In the case of the applications described, it is often practical to implement certain components, including microchips and micro-controllers, as well as related computing processes on a board module, wherein this board module is arranged on the motherboard or base board as a component.

For contacting of such a board module on the base board, different approaches are known from practice, wherein the present invention relates, in concrete terms, to a connection by means of soldering. The present invention particularly proceeds, in this regard, from German Patent Application No. DE 10 2020 108 239 A1 as the generic state of the art, wherein there, too, different methods of contacting are described in the discussion of the state of the art. Explicit reference is made to the corresponding representations.

German Patent Application No. DE 10 2020 108 239 A1 concerns itself with a reduction in the development effort in the case of a soldering board arrangement, wherein different combinations of base boards and soldering board modules are also supposed to be made possible in a simple manner. In this connection, a soldering board module system is proposed, in which different soldering board modules can be made available in different pre-defined sizes.

Customers in the sector of embedded electronics increasingly use finished devices in the form of a "system on module," which are offered by suppliers as standard products. This allows the customer to concentrate on attractive unique characteristics of their products, which are often anchored in software and functionalities implemented with it, and less in the concrete embodiment of the hardware. From the customer's point of view, it is then essentially relevant that a hardware environment having sufficient computing power, suitable interfaces, and the further required functionalities is made available.

Frequently, there is also an effort to ensure that care of a system on module in the form of a soldering board module is taken on or at least supported by the vendor, and thereby corresponding administration effort and corresponding know-how can be eliminated on the part of the customer.

Also taking into consideration temporary restrictions with regard to the availability of individual products and components, as well as a need for scalable computing power, customers frequently look for standardization in the use of soldering board modules in the form of a system on module, for example so as to optionally be able to use soldering board modules with processors and components of different manufacturers as replacements for one another. By means of such standardization, investment protection of the customer's own development and long-term delivery availability can be achieved.

Against this background, it is known to use systems on module (SOMs) having standard form factors such as Qseven, Smarc or OSM (OSM Standard for system on modules). Corresponding standards are defined, administered, or at least explained by the Standardization Group for Embedded Technologies e.V. (SGET https://sget.org/). It is the goal of these standards to create computing modes that can be universally used and interchanged, which have the same form factors and a standardized pin assignment, wherein similar approaches are known from motherboard bases of PCs.

However, the standard form factors described above only satisfy the purpose of embedded controllers and processors in part. As the result of setting fixed sizes and interfaces or at least optional interfaces, the freedom of design is restricted. Depending on the application, it is conceivable that the standard form factors are either too large or too small. Scalability provided in accordance with the OSM standard, with different sizes, can counter these disadvantages only in part.

Although the similar principle of German Patent Application No. DE 10 2020 108 239 A1 makes a certain flexibility possible, greater adaptability is desirable.

In this regard, it should also be noted that proceeding from the establishment of a specific standard, further new interfaces and functionalities, which could not yet be taken into consideration when the standard was established, subsequently can still become relevant. It can then be practical to allow a certain flexibility both with regard to the assignment of the soldering connection points and with regard to their number and arrangement.

SUMMARY OF THE INVENTION

The present invention relates, in concrete terms, to a soldering board arrangement, wherein then the base board has a plurality of soldering connection points on the holding section for a soldering board module. The soldering board module itself has soldering connection points in a corresponding raster, which are then connected, i.e. soldered in pairs. Within the scope of the present invention, the soldering connection points are also referred to as pins, according to general language use. Accordingly, the assignment of the soldering connection points is also referred to as pin assignment.

In connection with the pin assignment, it is established at which concrete position, i.e., at which concrete soldering connection points which signals and interfaces are made available. The pin assignment establishes the communication and general electrical contacting between the base board or motherboard and the soldering board module.

Aside from the voltage supply, synchronization signals, and the like, standardized communication protocols such as, for example, Ethernet/Lan, USB, UART, GPIO, a CAN bus, a wireless interface, analog connectors, or the like, standardized communication protocols, for example, are also established by means of the pin assignment.

The present invention is based on the task of indicating a soldering board arrangement having expanded design freedom.

The object of the invention and the solution for the task is a soldering board arrangement having a base board, which comprises a holding section having a plurality of more than 100 soldering connection points for electrical contacting, for a soldering board module. The holding section of the soldering board arrangement has soldering connection strips that differ from the soldering connection points, which strips extend outward from the direction of a center of the holding section, and allow soldering to corners of soldering board modules of different sizes.

Within the scope of the invention, the size of the soldering board modules can be very freely selected, at least in a certain value range. It is not necessary to define concrete gradations of the categorized values in advance, so as to then allow soldering of the corners of the soldering board modules in a defined manner.

Within a predetermined size range, an adaptation is possible within the scope of the invention, so as to place further soldering connection points in an outer region, for example. For example, it is also possible to offer different variants with an additional function, proceeding from a basic configuration of the soldering board arrangement, and these can then be made available with soldering boards of a different size. Of course, the position of the soldering connection points on the base board, on the one hand, and on the soldering board modules, on the other hand, must be coordinated with one another, but it is also possible, for example, not to contact pins for optional functionalities.

As will still be explained in the following, pin assignments required for the basic functionality of the soldering board arrangement, for example, such as, for example, required standard interfaces, connectors for the power supply and for energy management, can be arranged in an inner region, wherein the corresponding assignment can then be structured precisely the same for a set of soldering board modules. In this regard, it can also be provided that the holding section has a free region without soldering connection points in its center.

Independent of whether a corresponding free region is present, the holding section can have, proceeding from the center, in accordance with the basic functionality described above, a first, preferably frame-shaped contact region having first soldering connection points. In this regard, the first soldering connection points can represent, in particular, a minimal configuration, which can also be referred to as a minimal footprint. By means of the minimal configuration, the required connectors for power supply, control, and for data communication are then made available. In this regard, the minimal configuration described can also correspond to a minimum size of the soldering board module made available as a system, along an outer circumference of the arrangement composed of soldering connection points, if the corresponding soldering board module is merely supposed to have a basic functionality.

Even such a soldering board module having a minimal size is supposed to make soldering at its corners possible, and for this purpose, within the scope of the invention, the soldering connection strips are provided. Proceeding from the center, the soldering connection strips can then be structured in such a manner that they begin where the corners of a soldering board module having a minimal size are located, wherein then the soldering connection strips extend outward from there, preferably straight, alternatively also curved, bent, or angled away. By means of the progression of the soldering connection strips, step-free scalability of the soldering board modules is then possible.

Within the scope of the scalability described, further soldering connection points can be made available on the base board and/or the soldering board module. It is conceivable, for example, that the base board in total has a maximal configuration with additional soldering connection points, which extend, for example, all the way to an end of the soldering connection strips.

Depending on the desired functionality, in each instance, soldering board modules having any desired size between the minimal configuration and the maximal configuration can then be made available.

As described, a space that goes beyond the minimal configuration can be used for placement of further soldering connection points. Additionally or alternatively, however, it is also conceivable that a base area that goes beyond the surface area of the soldering connection points as such is needed for placement of components on the soldering board modules. Even in the case of an increase in the base area of the soldering board module required as a result, it is then possible, in the case of a suitable design of the soldering connection strips, to connect this area with the soldering connection strips at their corners.

Within the scope of the invention, it is understood that the soldering board modules make soldering possible at their corners, and for this purpose, corresponding metallization is practical there, for example.

According to a preferred embodiment of the invention, it is provided that the holding section has a rectangular shape, in particular a square shape. The soldering connection strips can then extend on at least two corners of the rectangular shape. Preferably, of course, it is provided that a soldering connection strip is provided at all four corners of the rectangular shape, in each instance, so as to be able to solder each corner of an assigned soldering board module.

According to a preferred further development, it can be provided that the soldering connection strips run along end sections of diagonals. Different soldering board modules having a rectangular shape, in particular a square shape, can then be scaled in different sizes, with the ratio of the sides remaining the same. Fundamentally, however, it is also conceivable to change the method of scaling. For example, it can also be provided that the soldering connection strips run diagonally, at first, and are then angled away. This would correspond to uniform scaling, at first, wherein then an enlargement takes place only along one direction, for example so as to make further construction space available.

Fundamentally, the variants described should be viewed as examples, and do not restrict the freedom of design of the invention.

The rectangular shape of the holding section, which is preferably provided, can have a side length, for example, between 25 mm and 60 mm, in particular between 35 mm and 45 mm.

As was also explained above, the soldering connection strips extend outward, proceeding from the center of the holding section, wherein the length of the soldering connection strips can represent, in particular, the difference between a minimal size and a maximal size. Within the scope of the invention, the soldering connection strips can have a length, for example, between 7 mm and 15 mm.

Perpendicular to this, the width can lie, for example, between 0.4 mm and 2 mm. Corresponding to the slanted arrangement, preferably along diagonals, the soldering connection strips can have an arrow shape at the beginning and/or at their end, in each instance.

Within the scope of the invention, it is possible to define modules having different configurations for different functionalities and combinations of base board and soldering board modules, which configurations are also described as feature sets within the scope of the invention. In this regard, these configurations are established in a more varied way, on the one hand, and also more concretely, on the other hand, in comparison with existing standard form factors Qseven, Smarc and OSM. With this approach, it is possible, for example, that in every feature set, in comparison with the existing standards, a greater number of obligatory interfaces having a fixed position is made available.

For customers, reliable compatibility within the feature set therefore occurs, wherein the planning effort during design can also be reduced.

Within a feature set, furthermore, a specific number of optimal interfaces, which also preferably have a fixed position with regard to the placement of the soldering connection points, can be defined, in addition to a great number of obligatory interfaces. In this regard, the optional interfaces can exclusively orient themselves relative to the partial amount of controllers and processors that belong to the feature set, in each instance, so that no interfaces of outside controllers and processors take up space or waste space.

Specifically the number of different feature sets, which is greater in comparison with existing standard defaults, can be implemented very well within the scope of the invention, by means of the flexibility with regard to the size of the holding section and the number of soldering connection points.

As was explained above, it is provided, according to a preferred embodiment of the invention, that the first contact region corresponds to a minimal configuration, which is structured the same and, in particular, occupied in the same way in the case of all the soldering board modules that are to be combined with the base board. In this regard, the first contact region can have, for example, between 100 and 300, in particular between 170 and 230 first soldering connection points.

According to a preferred further development of the invention, it can then be provided that the holding section has a second contact region, preferably arranged in a frame shape around the first contact region, having two soldering connection points, wherein the soldering connection strips extend through the second contact region.

The second soldering connection points then relate, according to the above explanations, to interfaces that can be but do not have to be supported by the different soldering board modules. It is practical if the pin assignment of the signals is established in advance. This preferably also holds true for the electrical connection values such as, for example, the input and output levels.

The second soldering connection points can also be assigned to proprietary functionalities, which are provided only in the case of specific soldering board modules, wherein then, in general, no precise assignment of the corresponding pin assignment to specific functionalities has to take place as yet.

Furthermore, in the case of the second soldering connection points, soldering connection contacts that lie farthest to the outside can also be provided, as a type of reserve, which contacts are not yet assigned, at first, but rather allow use in future functionalities and applications, without the entire design and shape of the holding section having to be changed. Thereby it is possible to subsequently define further feature sets, which then fall back on these soldering connection points, which have been provided as spares.

The second contact region can, accordingly, be divided up into a partial region for preferred and proprietary functionalities and a preferably outer partial region, in comparison, having soldering connection points for future applications. The second contact region can fundamentally have, for example, between 200 and 400, in particular between 230 and 330 second soldering connection points.

According to the above explanations, a distinction is made, with regard to the design of the holding section, between the first soldering connection points as an inner minimal configuration and the second soldering connection points arranged around the first, wherein then, depending on the demand for and the availability of further functionalities going beyond the minimal configuration, the size of a specific soldering board module can be freely selected, if specific second soldering connection points are left out.

Preferably, in this regard, circumferential rows of second soldering connection points are left out, if possible. Then a smaller dimension of the corresponding soldering board module occurs, which nevertheless can be fastened to the soldering connection strips with its corners.

Fundamentally, it is also possible to leave out second soldering connection points not around the entire circumference but only on individual sides, as a row, so that then, if applicable, the side ratio of the corresponding soldering board module can change. By means of making the soldering connection strips available, such a soldering board module can also be effectively attached to the base board by means of soldering.

As was also explained above, the soldering board arrangement according to the invention preferably comprises a group of different soldering board modules that can be contacted on the holding section, which modules differ, in particular, with regard to their size and function. Depending on the requirements, a suitable soldering board module can then be selected from the group, in order to place it on the holding section by means of soldering.

Previously, it was also already emphasized that the soldering board modules of the group preferably have an equal number of first soldering connection points having the same arrangement in the same assignment, so as to be connected with the first soldering connection points of the holding section. The variability described then results from the fact that at least a part of the soldering board modules of the group have a number of second soldering connection points, which numbers are different from one another.

If, for example, a soldering board module of the group does not have specific preferred or proprietary functionalities, the corresponding soldering connection points can be left out, wherein thereby the base area of the corresponding soldering board module can be reduced. It is practical if the corresponding soldering board module is then so small, with regard to its base area, that corresponding to the soldering connection points left out on the soldering board module, the related soldering connection points of the holding section are also exposed.

In contrast, it can be disadvantageous if, in the case of a soldering board module of the group, specific preferred or proprietary functionalities are not provided, and the board of the soldering board module or circuit tracks configured on it extend outside of the required soldering connection points, over non-contacted soldering connection points of the holding section. In the case of vibrations, for example, the risk of a short circuit or a malfunction, in general, can then exist, even if corresponding regions on the underside of the soldering board module are at first covered with an insulating varnish or the like. In the case of a corresponding constellation, it is also possible to structure soldering connection points on the soldering board module as blind connectors, which are not contacted further on the soldering board module or within the soldering board module. By means of the blind connectors, which are not contacted further, the soldering connection points of the holding section that lie underneath are covered, so that at the corresponding positions, circuit tracks cannot be accidentally provided in the design of the soldering board module. Furthermore, the blind connectors also allow soldering to the soldering connection points of the holding section, and thereby the mechanical stability can also be increased.

It is practical if the soldering board modules are structured, within the scope of the invention, as a system on module, in other words they usually have at least one microprocessor, communication interfaces and a memory, in each instance.

As was already explained above, a basic idea of the present invention relates to a certain interchangeability of different soldering board modules, at least within the scope of predetermined configurations or feature sets. The soldering board module in the form of a system on module then represents an independent computing device, wherein control signals are also supposed to be transmitted between the base board and the soldering board module arranged on it, in each instance, which signals are assigned, in particular, to the first contact region with the first soldering connection points.

Corresponding control signals are, for example, a reset input, a reset output, an enable or on/off signal, a status signal, a wakeup signal from the sleep state or the like. It is problematic, in this regard, that in contrast to standard interfaces, such signals can be defined differently in different microprocessors, and this can stand in the way of compatibility.

Against this background, it is provided, according to a preferred embodiment of the invention, that the base board has a conversion module that is set up for converting control signals of the base board into different control signals specific for different soldering board modules of the group. In this regard, the conversion module must be programmed or programmable in such a manner that correspondingly different specific control signals can be generated. In the placement of a concrete soldering board module on the base board, suitable adaptation or programming must then be undertaken, so that the specific control signals can be generated by the conversion module.

In the case of the first soldering connection points and second soldering connection points of the holding section or of the soldering board modules, grounding connectors are provided. Thus it is provided, according to a preferred embodiment of the invention, that a plurality of the soldering connection points forms grounding connectors, wherein the proportion of the grounding connectors preferably lies between 10% and 35%, in particular between 18% and 27% of the soldering connection points provided in total. In this regard the grounding connectors can be placed in such a manner that ultimately every signal connector is situated next to or at least in the vicinity of a grounding connector. Viewed geometrically, between typically 2 and 4 signal connectors, for example, can share a grounding connector.

The soldering board modules are preferably structured with multiple layers. A number of layers between 4 and 18, in particular between 6 and 12 intermediate layers is typical, for example, wherein the present invention can be used in a practical manner even in the case of a greater or lesser number of layers. In the case of the typical multi-layer structure, conductor tracks, a grounding layer, or also a power supply layer can be provided on the individual layers. In total, multiple grounding layers and/or supply layers can be provided.

With regard to good shielding and, in total, good electromagnetic compatibility, it is advantageous if at least one inner grounding layer extends over a large part of the soldering board module. For example, it can be provided that the conductive layer or coating of the grounding layer that is connected to the grounding extends over at least 80% of the surface of the soldering board module. It is practical if the grounding connectors are directly connected with the at least one grounding layer. By means of at least an extended grounding layer, good shielding occurs. By means of the placement of multiple grounding layers, such shielding is further improved. In the case of a multi-layer structure, a grounding layer can be provided relatively far down and relatively far up, for example, so that then shielding can be achieved for the intermediate space, as well.

The grounding properties can be further improved in that the at least one grounding layer is brought up to just before or, particularly preferably, directly to the edge of the soldering board module or the soldering board modules. If the soldering board module is then also provided with a circumferential metallization, practically complete shielding occurs for the enclosed space.

BRIEF DESCRIPTION OF THE DRAWINGS

Other objects and features of the invention will become apparent from the following detailed description considered in connection with the accompanying drawings. It is to be understood, however, that the drawings are designed as an illustration only and not as a definition of the limits of the invention.

In the drawings.

DETAILED DESCRIPTION OF PREFERRED EMBODIMENTS

Figure 1:
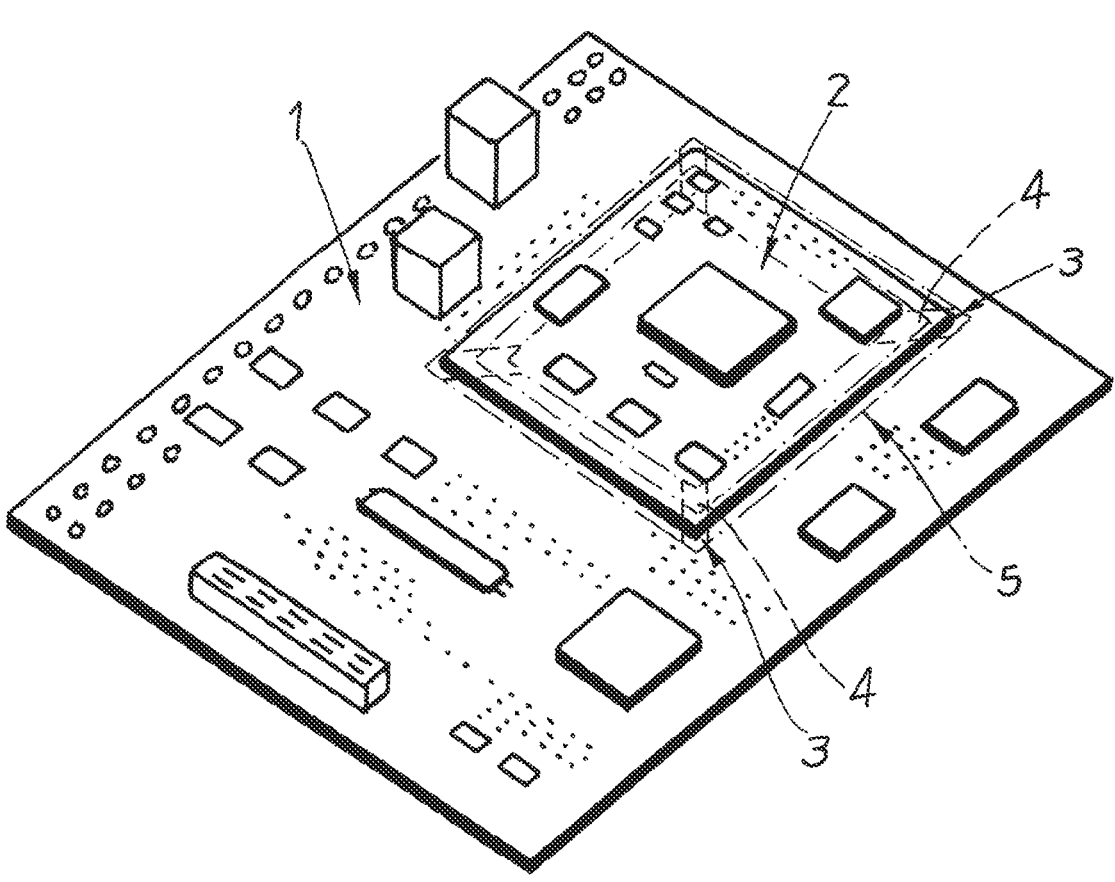
FIG. 1 shows the arrangement of a base board with a soldering board module arranged on it.

FIG. 1 shows a soldering board arrangement with a base board 1 and a soldering board module 2 arranged on it. The soldering board module 2 makes a system on module available, which has an independent computing unit and thereby makes a specific functionality available for the base board. Corresponding components of the soldering board module 2 are merely indicated. The soldering board module 2 comprises at least a microprocessor, a memory, and makes a plurality of communication interfaces available, in particular so as to allow a data exchange with or by way of the base board 1.

Within the scope of the invention, the soldering board module 2 is soldered to the base board 1 and thereby fastened to it. In FIG. 1, it is also indicated that the soldering board module 2 is soldered to the base board 1 at its corners 3. This fixation at the corners serves for particularly reliable and stable placement. Fundamentally, fastening at the corners 3 can also contribute to further grounding.

In FIG. 1, in this regard, soldering connection strips 4 are indicated in a holding section 5 of the base board 1, and these will still be described in detail below.

Figure 2:
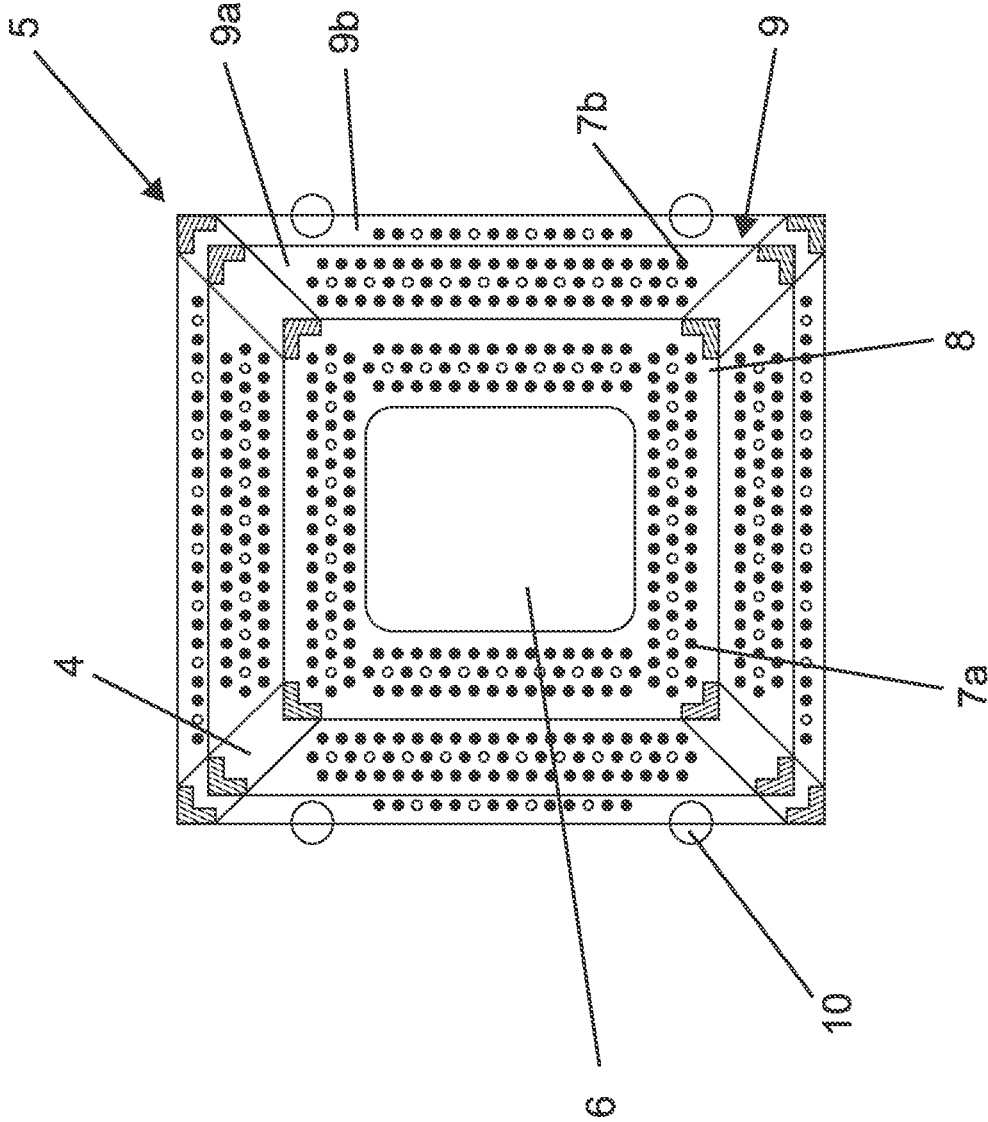
FIG. 2 shows a holding section of the base board, with a plurality of soldering connection points.

FIG. 2 shows the holding section 5 of the base board 1 in detail. It can be seen that the holding section 5, as a whole, has a square shape, wherein the side length on the outside circumference can amount to between 25 mm and 60 mm, in particular between 35 mm and 45 mm, for example.

The holding section 5 has a plurality of soldering connection points 7a, 7b around a free region 6 in its center, wherein at first a first contact region 8 is formed by the first soldering connection points 7a arranged in a frame shape there, around the free region 6. With regard to different soldering board modules 2 to be arranged on the holding section 5, the first contact region 8 corresponds to a minimal configuration with regard to the first soldering connection points 7a, which are also referred to as pins.

Basic functionalities are made available by the first soldering connection points 7a of the first contact region 8, which functionalities must be present on each of the soldering board modules 2 to be placed on the base board 1, wherein according to a preferred embodiment, all the first soldering connection points 7a are always present, and their electrical assignment is also predetermined.

In total, a part of all the soldering connection points 7a, 7b is configured as grounding connectors, wherein a distinction between grounding pins and signal pins is made in the representation of FIG. 2. In this regard, solid circles represent grounding pins as example, and empty circles represent signal pins.

In order to make basic functionality available, a soldering board module 2 can be made available, which extends only over the first contact region 8. The corners 3 of such a soldering board module 2 then lie, accordingly, against the corners of the first contact region 8, wherein the soldering connection strips 4 that begin there allow soldering of the corners 3.

A second contact region 9, having the second soldering connection points 7b, extends in frame shape around the first contact region 8. The soldering connection strips 4 extend at all corners of the holding section 5, along diagonals, through the second contact region 9, and end at the greatest outside circumference of the holding section 5.

In this regard, the second contact region 9 or a corresponding contact surface is not provided in the case of all the soldering board modules 2 to be placed on the base board 1, depending on the requirements. In particular, only a partial region of the second contact region 9 can be used, so that variable sizes of the soldering board module 2 can be provided along the soldering connection strips 4 and then be attached at all the corners.

As an example, the second contact region 9 can be divided up into an inner partial region 9a and an outer partial region 9b. In this regard, the inner partial region 9a can be assigned to preferred interfaces, for example, which can but do not have to be provided in the case of a single soldering board module. Furthermore, proprietary interfaces can also be provided there for individual soldering board modules, which interfaces have not yet been precisely established in terms of their assignment (in general aside from the assignment of the grounding pins). These preferred and proprietary interfaces can then be described, in the case of a configuration defined as a feature set within the scope of the invention, so as to allow good compatibility of different soldering board modules, which are defined within the scope of a feature set.

The outer partial region 9b can be provided, for example, for interfaces that are not yet defined at first, and are only taken into consideration during subsequent definitions of feature sets.

With regard to the basic structure, a certain inventory of second soldering connection points 7b is thereby made available. Directly during definition of the corresponding feature set, the second soldering connection points 7b of the outer partial region 9b are then usually not being used yet, so that then, corresponding soldering board modules 2 do not yet have to cover this outer partial region and can be made correspondingly smaller.

Furthermore, it should also be noted that within the inner partial region 9a, rows of second soldering connection points 7b around the circumference or also just on a part of the sides can be left out, so that the soldering board module 2 can then be produced to be correspondingly smaller. Then, too, more reliable contacting by means of soldering is then possible by means of making the soldering connection strips 4 available. This also holds true if, proceeding from the rectangular shape of the holding section 5 as shown, an assigned soldering board module 2 deviates from the square shape merely at one side, by leaving out second soldering connection points 7b.

In the exemplary embodiment shown, the first contact region comprises 196 first soldering connection points 7a. The second contact region 9 comprises 308 second soldering connection points 7b, of which 232 are arranged in the inner partial region 9a and 76 are arranged in the outer partial region 9b. In this regard, the concrete number of first and second soldering connection points 7a, 7b is given only as an example, of course, and represents a possible, particularly suitable embodiment.

The base board 1 furthermore has fastening holes 10, at which coolers, for example, or other additional devices can be attached. In particular for experimental purposes, it can also be provided that the soldering board module 2 provided for soldering is arranged on the base board 1 merely by means of a conductive connection such as, for example, a conductive rubber. In the case of such an embodiment, the fastening holes 10 can also be provided for a housing or a clamping apparatus, with which the soldering board module 2 is pressed onto the base board 1 by way of the conductive rubber.

Although only a few embodiments of the present invention have been shown and described, it is to be understood that many changes and modifications may be made thereunto without departing from the spirit and scope of the invention.

What is claimed is:

1. A soldering board arrangement having a base board, which comprises a holding section that has a plurality of more than 100 soldering connection points configured for electrical contacting for a soldering board module, wherein the holding section has soldering connection strips that differ from the soldering connection points, and a group of different soldering board modules that are configured to be contacted on the holding section, wherein the different soldering board modules differ with regard to size and function, wherein the strips extend outward from a direction of a center of the holding section, and allow soldering to corners of the soldering board modules (2) of different sizes.

2. The soldering board arrangement according to claim 1, wherein the holding section has a rectangular shape, and wherein the soldering connection strips extend on at least two corners of the holding section, along end sections of diagonals of the rectangular shape.

3. The soldering board arrangement according to claim 2, wherein the rectangular shape has side lengths between 25 mm and 60 mm.

4. The soldering board arrangement according to claim 3, wherein the rectangular shape has side lengths between 35 mm and 45 mm.

5. The soldering board arrangement according to claim 1, wherein the soldering connection strips each have a length between 7 mm and 15 mm.

6. The soldering board arrangement according to claim 1, wherein the holding section has a free region without soldering connection points in a center of the holding section.

7. The soldering board arrangement according to claim 1, wherein the holding section, proceeding from a center, has a first contact region having first soldering connection points, wherein the first contact region is arranged to lie on an inside, relative to the soldering connection strips.

8. The soldering board arrangement according to claim 7, wherein the first contact region has between 100 and 300 first soldering connection points.

9. The soldering board arrangement according to claim 8, wherein the first contact region has between 170 and 230 first soldering connection points.

10. The soldering board arrangement according to claim 7, wherein the holding section (5) has a second contact region arranged around the first contact region, the second contact region having second soldering connection points, wherein the soldering connection strips extend through the second contact region.

11. The soldering board arrangement according to claim 10, wherein the second contact region has between 200 and 400 second soldering connection points.

12. The soldering board arrangement according to claim 10, wherein the second contact region has between 230 and 330 second soldering connection points.

13. The soldering board arrangement according to claim 1, wherein the soldering board modules of the group have the same number of first soldering connection points having the same arrangement and the same assignment.

14. The soldering board arrangement according to claim 13, wherein at least a part of the soldering board modules of the group has a number of second soldering connection points where the numbers of second soldering connection points in each soldering board module of the group differ from one another.

15. The soldering board arrangement according to claim 1, wherein the soldering board modules of the group each have at least one microprocessor, communication interfaces, and a memory.

16. The soldering board arrangement according to claim 1, wherein the base plate has a conversion module that is set up for converting control signals of the base board to different control signals that are specific for different soldering board modules of the group.

* * * * *